United States Patent
Ooguri et al.

(10) Patent No.: US 11,230,666 B2
(45) Date of Patent: Jan. 25, 2022

(54) METHOD FOR PRODUCING CERAMIC SINTERED BODY, CERAMIC SINTERED BODY, AND LIGHT EMITTING DEVICE

(71) Applicant: NICHIA CORPORATION, Anan (JP)

(72) Inventors: Hirofumi Ooguri, Komatsushima (JP); Shoji Hosokawa, Tokushima (JP)

(73) Assignee: NICHIA CORPORATION, Anan (JP)

( * ) Notice: Subject to any disclaimer, the term of this patent is extended or adjusted under 35 U.S.C. 154(b) by 22 days.

(21) Appl. No.: 16/695,702

(22) Filed: Nov. 26, 2019

(65) Prior Publication Data
US 2020/0172804 A1 Jun. 4, 2020

(30) Foreign Application Priority Data
Nov. 30, 2018 (JP) .............................. JP2018-225511

(51) Int. Cl.
C09K 11/77 (2006.01)
H01L 33/50 (2010.01)
C09K 11/08 (2006.01)

(52) U.S. Cl.
CPC ...... C09K 11/7734 (2013.01); C09K 11/0883 (2013.01); H01L 33/502 (2013.01); H01L 2933/0041 (2013.01)

(58) Field of Classification Search
CPC .......... C09K 111/7734; C09K 11/0883; C09K 11/7784; C09K 11/7734; H01L 33/502; H01L 2933/0041; C04B 35/6262
(Continued)

(56) References Cited

U.S. PATENT DOCUMENTS
2008/0165523 A1 7/2008 Schmidt et al.
2010/0012964 A1 1/2010 Copic et al.
(Continued)

FOREIGN PATENT DOCUMENTS
JP 2008527706 A 7/2008
JP 2014234487 A 12/2014
(Continued)

*Primary Examiner* — Thinh T Nguyen
(74) *Attorney, Agent, or Firm* — Hunton Andrews Kurth LLP

(57) ABSTRACT

Provided are a method for producing a ceramic sintered body having improved light emission intensity, a ceramic sintered body, and a light emitting device. The method for producing a ceramic sintered body comprises preparing a molded body that contains a nitride fluorescent material having a composition containing: at least one alkaline earth metal element $M^1$ selected from the group consisting of Ba, Sr, Ca, and Mg; at least one metal element $M^2$ selected from the group consisting of Eu, Ce, Tb, and Mn; Si; and N, wherein a total molar ratio of the alkaline earth metal element $M^1$ and the metal element $M^2$ in 1 mol of the composition is 2, a molar ratio of the metal element $M^2$ is a product of 2 and a parameter y and wherein y is in a range of 0.001 or more and less than 0.5, a molar ratio of Si is 5, and a molar ratio of N is 8, and wherein the nitride fluorescent material has a crystallite size, as calculated by X-ray diffraction measurement using the Halder-Wagner method, of 550 Å or less, and calcining the molded body at a temperature in a range of 1,600° C. or more and 2,200° C. or less to obtain a sintered body.

9 Claims, 2 Drawing Sheets

(58) Field of Classification Search
USPC .............. 438/22, 25.26, 27, 29; 257/98, 100
See application file for complete search history.

(56) References Cited

U.S. PATENT DOCUMENTS

| | | |
|---|---|---|
| 2010/0142181 A1 | 6/2010 | Schmidt et al. |
| 2016/0122636 A1* | 5/2016 | Kechele et al. ... C09K 11/7734 428/402 |
| 2017/0015902 A1 | 1/2017 | Weiler et al. |
| 2017/0321866 A1 | 11/2017 | Asami et al. |
| 2018/0277720 A1 | 9/2018 | Zheng et al. |

FOREIGN PATENT DOCUMENTS

| | | |
|---|---|---|
| JP | 2018531413 A | 10/2018 |
| WO | 2006/072918 A1 | 7/2006 |
| WO | 2008/056300 A1 | 5/2008 |
| WO | 2008/096301 A1 | 8/2008 |
| WO | 2015/135888 A1 | 9/2015 |
| WO | 2016117623 A1 | 7/2016 |

\* cited by examiner ns1 METHOD FOR PRODUCING CERAMIC SINTERED BODY, CERAMIC SINTERED BODY, AND LIGHT EMITTING DEVICE

CROSS-REFERENCE TO RELATED PATENT APPLICATION

This application claims priority to Japanese Patent Application No. 2018-225511, filed on Nov. 30, 2018, the disclosure of which is hereby incorporated reference in its entirety.

BACKGROUND

Technical Field

The present disclosure relates to a method for producing a ceramic sintered body, a ceramic sintered body, and a light emitting device.

Description of Related Art

A light emitting device using a light emitting element such as an LED or an LD is constituted by combining a light emitting element serving as an excitation light source and a member containing a fluorescent material that absorbs a part of light emitted from the light emitting element and converts the wavelength of the light to a different wavelength. The light emitting device emits mixed color light of the light emitted from the light emitting element and the light emitted from the fluorescent material. Such a light emitting device is being utilized in a wide variety of fields such as light emitting devices for vehicles and indoor lighting, backlight sources for liquid crystal display devices, illuminations, and light source devices for projectors. In this specification, the "fluorescent material" is used in the same meaning as a "fluorescent phosphor".

Examples of the fluorescent material may include a fluorescent material capable of emitting yellow to green light by the excitation light emitted from the light emitting element, and a fluorescent material capable of emitting red light. Examples of the fluorescent material capable of emitting yellow or green light may include a rare earth aluminate fluorescent material, a silicate fluorescent material, and a Ca-α-SiAlON fluorescent material. Examples of the fluorescent material capable of emitting red light may include a nitride-based fluorescent material using europium as an activating element, and a fluoride-based fluorescent material using manganese as an activating element.

As a member containing a fluorescent material, for example, Japanese Unexamined Patent Publication No. 2014-234487 discloses a sintered body containing an inorganic fluorescent material obtained by mixing an oxide serving as a binder, such as glass powder, with an inorganic fluorescent material powder, and melting the binder, followed by solidifying. International Unexamined Patent Publication No. 2016/117623 discloses a sintered body containing a fluoride inorganic binder and a nitride fluorescent material.

However, in the sintered body disclosed in Japanese Unexamined Patent Publication No. 2014-234487, the oxide serving as a binder reacts with the fluorescent material at the time of forming the sintered body, and the fluorescent material may not emit light or may hinder the light emission. In the sintered body disclosed in International Unexamined Patent Publication No. 2016/117623, the fluoride inorganic binder may react with the nitride fluorescent material to adversely affect the light emission characteristics of the nitride fluorescent material.

Thus, the present disclosure has an object to provide a method for producing a ceramic sintered body having improved light emission intensity without adversely affecting the light emission characteristics of a fluorescent material, a ceramic sintered body, and a light emitting device.

SUMMARY

The present disclosure includes the following embodiments.

A first embodiment of the present disclosure is a method for producing a ceramic sintered body including preparing a molded body that contains a nitride fluorescent material having a composition containing: at least one alkaline earth metal element $M^1$ selected from the group consisting of Ba, Sr, Ca, and Mg; at least one metal element $M^2$ selected from the group consisting of Eu, Ce, Tb, and Mn; Si; and N, wherein a total molar ratio of the alkaline earth metal element $M^1$ and the metal element $M^2$ in 1 mol of the composition is 2, a molar ratio of the metal element $M^2$ is a product of 2 and a parameter y wherein y is in a range of 0.001 or more and less than 0.5, a molar ratio of Si is 5, and a molar ratio of N is 8, and wherein the nitride fluorescent material has a crystallite size, as calculated by X-ray diffraction measurement using the Halder-Wagner method, of 550 Å or less, and calcining the molded body at a temperature in a range of 1,600° C. or more and 2,200° C. or less to obtain a sintered body.

A second embodiment of the present disclosure is a ceramic sintered body that is composed of a nitride fluorescent material having a composition containing: at least one alkaline earth metal element $M^1$ selected from the group consisting of Ba, Sr, Ca, and Mg; at least one metal element $M^2$ selected from the group consisting of Eu, Ce, Tb, and Mn; Si; and N, wherein a total molar ratio of the alkaline earth metal element $M^1$ and the metal element $M^2$ in 1 mol of the composition is 2, a molar ratio of the metal element $M^2$ is a product of 2 and a parameter y wherein y is in a range of 0.001 or more and less than 0.5, a molar ratio of Si is 5, and a molar ratio of N is 8, wherein the relative density of the ceramic sintered body is 80% or less.

A third embodiment of the present disclosure is a light emitting device comprising the ceramic sintered body and an excitation light source having a light emission peak wavelength in a range of 380 nm or more and 570 nm or less.

In accordance with the above embodiments, a method for producing a ceramic sintered body having improved light emission intensity without adversely affecting light emission characteristics of a fluorescent material, a ceramic sintered body, and a light emitting device, can be provided.

DETAILED DESCRIPTION

The method for producing a ceramic sintered body, the ceramic sintered body, and the light emitting device according to the present disclosure will be hereunder described on the basis of embodiments. The embodiments described below are exemplifications for embodying the technical idea of the present invention, and the present invention is not limited to the following method for producing a ceramic sintered body, ceramic sintered body, and light emitting device. Standards according to Japanese Industrial Standard (JIS) Z8110 are applied to the relations between color names and chromaticity coordinates, the relations between wavelength ranges of light and color names of monochromatic lights, and the like.

Method for Producing Ceramic Sintered Body

The method for producing ceramic sintered body includes preparing a molded body that contains a nitride fluorescent material having a composition containing: at least one alkaline earth metal element $M^1$ selected from the group consisting of Ba, Sr, Ca, and Mg; at least one metal element $M^2$ selected from the group consisting of Eu, Ce, Tb, and Mn; Si; and N, in which a total molar ratio of the alkaline earth metal element $M^1$ and the metal element $M^2$ in 1 mol of the composition is 2, a molar ratio of the metal element $M^2$ is a product of 2 and a parameter y wherein y is in a range of 0.001 or more and less than 0.5, a molar ratio of Si is 5, and a molar ratio of N is 8, and wherein the nitride fluorescent material has a crystallite size, as calculated by X-ray diffraction measurement using the Halder-Wagner method, of 550 Å or less, and calcining the molded body at a temperature in a range of 1,600° C. or more and 2,200° C. or less to obtain a sintered body.

Figure 1:
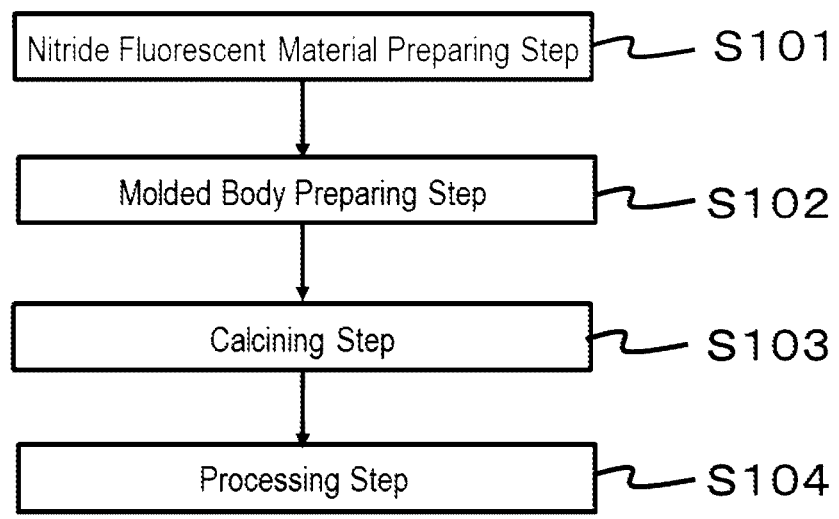
FIG. 1 is a flowchart describing exemplary steps in a method for producing a ceramic sintered body according to the present disclosure.

FIG. 1 is a flowchart describing one example of steps in the method for producing a ceramic sintered body. Steps in the method for producing a ceramic sintered body will be described by reference to FIG. 1. The method for producing a ceramic sintered body includes a molded body preparing step S102 and a calcining step S103. The method for producing a ceramic sintered body may include a nitride fluorescent material preparing step S101 of preparing a nitride fluorescent material having a crystallite size of 550 Å or less prior to the molded body preparing step S102, and may include a processing step S104 after the calcining step S103. The calcining step may include two or more calcining steps, such as a primary calcining step and a secondary calcining step.

The ceramic sintered body can be obtained by constituting a molded body using a nitride fluorescent material having a crystallite size, as calculated by X-ray diffraction measurement using the Halder-Wagner method, of 550 Å or less, and calcining the molded body at a temperature in a range of 1,600° C. or more and 2,200° C. or less. The crystallite size represents the size of an aggregation that can be regarded as a single crystal. The larger the value of the crystallite size, the better the crystallinity. The nitride fluorescent material having a crystallite size of 550 Å or less has a relatively low crystallinity. By forming a molded body using the nitride fluorescent material having a relatively low crystallite size of 550 Å or less and calcining the molded body at a temperature in a range of 1,600° C. or more and 2,200° C. or less, the number of voids in the resulting ceramic sintered body is reduced, that is, the relative density is increased, and a ceramic sintered body having high light emission intensity can be obtained. Although the reason why the light emission intensity of the resulting ceramic sintered body is increased is not clear, it is presumed that, since the nitride fluorescent material having a relatively small crystallite size has a part where the crystal structure can be changed, the molded body thus formed is calcined at a temperature in a range of 1,600° C. or more and 2,200° C. or less to change the part of the crystal structure, and the number of voids in the molded body is reduced, so that the light emission intensity becomes high. In certain examples, the molded body contains no binder composed of a fluoride or oxide. Oxygen contained in the molded body is less than 3% by mass with respect to 100% by mass of the molded body. Fluorine contained in the molded body is less than 1% by mass with respect to 100% by mass of the molded body. In such a case, it may be presumed that, since the molded body contains no binder composed of a fluoride or oxide, the nitride fluorescent material contained in the molded body does not react with the binder even when the molded body is calcined at a temperature in a range of 1,600° C. or more and 2,200° C. or less, the composition of the nitride fluorescent material is not adversely affected by the calcination, and the light emission intensity may not be reduced. When the crystallite size of the nitride fluorescent material is more than 550 Å, the light emission intensity of the nitride fluorescent material itself becomes higher than that of the nitride fluorescent material having a crystallite size of 550 Å or less. However, when the molded body is formed using the nitride fluorescent material having a crystallite size of more than 550 Å, the crystallinity of the nitride fluorescent material itself is good, and thus the relative density of the resulting sintered body is conversely low, that is, a large number of voids are contained therein even when calcining the molded body at a temperature in a range of 1,600° C. or more and 2,200° C. or less. Since the voids promote light scattering, the amount of light extracted to the outside of the ceramic sintered body is also reduced, and the light emission intensity is lowered.

In order to enhance the relative density of the ceramic sintered body after calcining the molded body, the crystallite size of the nitride fluorescent material constituting the molded body is 550 Å or less, and preferably 500 Å or less, more preferably 480 Å or less, even more preferably 450 Å or less. In order to improve the crystallinity of the nitride fluorescent material contained in the ceramic sintered body to some extent after calcining the molded body, the crystallite size of the nitride fluorescent material constituting the molded body is preferably 200 Å or more, more preferably 250 Å or more, even more preferably 300 Å or more.

As for the crystallite size of the nitride fluorescent material, XRD (X-ray diffraction) of the nitride fluorescent material is measured using an X-ray diffraction apparatus (for example, Ultima IV, manufactured by Rigaku Corporation). The measurement data is then analyzed by analysis software PDXL (manufactured by Rigaku Corporation) using No. 01-085-0101 of the ICDD (International Center for Diffraction Data) card of $Ba_2Si_5N_8$ single phase, and the crystallite size can be calculated according to the Halder-Wagner method.

Preparation of Nitride Fluorescent Material

The method for producing a ceramic sintered body preferably includes a step of preparing a nitride fluorescent material having a crystallite size of 550 Å or less. It is preferred that the nitride fluorescent material having a crystallite size of 550 Å or less can be obtained by: preparing a raw material mixture that contains a first compound containing at least one alkaline earth metal element $M^1$ selected from the group consisting of Ba, Sr, Ca, and Mg, a second compound containing at least one metal element $M^2$ selected from the group consisting of Eu, Ce, Tb, and Mn, and a compound containing Si; and heat-treating the raw material mixture at a temperature in a range of 980° C. or more and 1,680° C. or less in an atmosphere containing nitrogen.

In the nitride fluorescent material, crystallization of the obtained nitride fluorescent material can be suppressed by heat-treating the raw material mixture at a temperature lower than the temperature at which the raw material mixture is heat-treated for obtaining the nitride fluorescent material, preferably at a temperature in a range of 980° C. or more and 1,680° C. or less, to thereby obtain the nitride fluorescent material having a crystallite size of 550 Å or less. The temperature for heat-treating the raw material mixture is more preferably in a range of 1,000° C. or more and 1,670° C. or less, even more preferably in a range of 1,200° C. or more and 1,660° C. or less, still more preferably in a range of 1,300° C. or more and 1,650° C. or less, particularly preferably in a range of 1, 350° C. or more and 1,650° C. or less.

The atmosphere for heat-treating the raw material mixture is preferably an atmosphere containing nitrogen, or an inert atmosphere containing nitrogen. The content of nitrogen gas in the atmosphere for heat-treating the raw material mixture is preferably 70% by volume or more, more preferably 80% by volume or more.

The pressure in the atmosphere for heat-treating the raw material mixture is preferably in a range of 0.2 MPa or more and 2.0 MPa or less, more preferably in a range of 0.8 MPa or more and 1.0 MPa or less in terms of gauge pressure. By setting the atmosphere for heat-treating the raw material mixture to a pressurized atmosphere, decomposition of the crystal structure in the obtained nitride fluorescent material can be suppressed even in the case of obtaining a nitride fluorescent material having a crystallite size of 550 Å or less and a relatively low crystallinity.

The time for heat-treating the raw material mixture can be appropriately selected depending on the heat-treating temperature and the pressure of the atmosphere at the time of heat-treating, and is preferably in a range of 0.5 hour or more and 20 hours or less, more preferably in a range of 1 hour or more and 10 hours or less, even more preferably in a range of 1.5 hours or more and 9 hours or less. When the heat-treating time is in a range of 0.5 hour or more and 20 hours or less, decomposition of the obtained nitride fluorescent material can be suppressed even in the case of obtaining a nitride fluorescent material having a crystallite size of 550 Å or less and a relatively low crystallinity.

Examples of the first compound containing at least one alkaline earth metal element $M^1$ selected from the group consisting of Ba, Sr, Ca, and Mg may include hydrides, nitrides, fluorides, oxides, carbonates, and chlorides each containing an alkaline earth metal element $M^1$. Since the first compound containing an alkaline earth metal element $M^1$ contains few impurities, hydrides, nitrides, or fluorides containing an alkaline earth metal element $M^1$ are preferred, and nitrides are more preferred. The first compound may contain a trace amount of at least one element selected from the group consisting of Li, Na, K, B, and Al. The at least one element selected from the group consisting of Li, Na, K, B, and Al contained in the first compound is less than 1000 ppm by mass with respect to the total amount of the first compound. Specific examples of the first compound containing an alkaline earth metal element $M^1$ may include $BaH_2$, $Ba_3N_2$, $BaF_2$, $SrH_2$, $Sr_3N_2$, $Sr_2N$, $SrN$, $SrF_2$, $CaH_2$, $Ca_3N_2$, $CaF_2$, $MgH_2$, $Mg_3N_2$, and $MgF_2$. As the compound containing an alkaline earth metal element $M^1$, one kind of a compound containing one alkaline earth metal element $M^1$ selected from the group consisting of Ba, Sr, Ca, and Mg may be used; two or more kinds of compounds each containing one alkaline earth metal element $M^1$ may be used; or two or more kinds of compounds each containing two or more different alkaline earth metal elements $M^1$ may be used.

Examples of the second compound containing at least one metal element $M^2$ selected from the group consisting of Eu, Ce, Tb, and Mn may include hydrides, nitrides, fluorides, oxides, carbonates, and chlorides each containing a metal element $M^2$. Since the second compound containing a metal element $M^2$ contains few impurities, hydrides, nitrides, or fluorides containing a metal element $M^2$ are preferred, and nitrides are more preferred. Specific examples of the second compound containing a metal element $M^2$ may include $EuH_3$, $EuN$, $EuF_3$, $CeH_3$, $CeN$, $CeF_3$, $TbH_3$, $TbN$, $TbF_3$, $MnN_2$, $MnN_5$, and $MnF_2$. As the compound containing a metal element $M^2$, one kind of a compound containing one metal element $M^2$ selected from the group consisting of Eu, Ce, Tb, and Mn may be used; two or more kinds of compounds each containing one metal element $M^2$ may be used; or two or more kinds of compounds each containing two or more different metal elements $M^2$ may be used.

The compound containing Si may be a metal substantially containing Si alone, or may be an alloy of Si where a part of Si is substituted with at least one metal selected from the group consisting of Ge, Sn, Ti, Zr, Hf, B, Al, Ga, and In. Examples of the compound containing Si may include oxides, nitrides, fluorides, imide compounds, and amide compounds. Since the compound containing Si contains few impurities, nitrides, imide compounds, amide compounds, or fluorides are preferred, and nitrides are more preferred. Specific examples of the compound containing Si may include $SiO_2$, $Si_3N_4$, $SiF_4$, $Si(NH)_2$, $Si_2N_2NH$, and $Si(NH_2)_4$.

From the viewpoint of reactivity of each raw material and controlling particle diameter during and after the heat-treatment, the average particle diameter of each raw material is preferably in a range of about 0.1 μm or more and 10 μm or less, more preferably in a range of about 0.1 μm or more and 5 μm or less. The average particle diameter refers to Fisher Sub-Sieve Sizer's number measured by Fisher Sub-Sieve Sizer method.

The raw material mixture may contain a flux. When the raw material mixture contains a flux and the generation temperature of the liquid phase of the compound contained as the flux is substantially the same as the temperature in the heat-treatment, the reaction between the raw materials can be promoted by the flux. The flux is preferably a halide in order to promote the reaction between the raw materials. As the halide to be used as the flux, a chloride or a fluoride of rare earth metal, alkaline earth metal, or alkali metal can be used. The flux can be added as a part of the raw materials of the fluorescent material by adjusting the amount such that the elemental ratio of the cation contained in the flux becomes a part of the desired composition of the fluorescent material, or the flux can be added thereto after adjusting the raw materials to be the desired composition of the fluorescent material.

When the raw material mixture contains a flux, in order to obtain a nitride fluorescent material having a desired crystallite size, for example, the content of the flux in the raw material mixture is preferably 10% by mass or less, more preferably 5% by mass or less based on 100% of the raw material mixture.

The weighed raw materials may be mixed in wet or in dry using a mixing machine to obtain a raw material mixture. As the mixing machine, a ball mill which is generally industrially used, as well as a grinding machine such a vibration mill, a roll mill, or a jet mill can be used, and the raw materials can be ground to enlarge the specific surface area. In order to adjust the specific surface area of the powder in a certain range, the raw materials can be classified using: a wet separator such as a sedimentation tank, a hydrocyclone, or a centrifugal separator; or a dry classifier such as a cyclone or an air separator, which are generally industrially used.

The raw material mixture can be set in a crucible or a boat made of carbon such as graphite, boron nitride (BN), alumina ($Al_2O_3$), tungsten (W), molybdenum (Mo), and heat-treated in a furnace to obtain a nitride fluorescent material.

The nitride fluorescent material obtained by heat-treating the raw material mixture may be subjected to post-treatments such as grinding, dispersion, solid-liquid separation, and drying. The solid-liquid separation can be performed by an ordinary industrial method such as filtration, suction filtration, pressure filtration, centrifugation, or decantation. The drying can be performed using an ordinary industrial apparatus such as a vacuum drier, a hot air heating drier, a conical drier, or a rotary evaporator.

The obtained nitride fluorescent material preferably has a composition represented by the following formula (I).

$$(M^1_{1-y}M^2_y)_2Si_5N_8 \quad (I)$$

wherein $M^1$ represents at least one element selected from the group consisting of Ba, Sr, Ca, and Mg; $M^2$ represents at least one element selected from the group consisting of Eu, Ce, Tb, and Mn; and y satisfies $0.001 \leq y < 0.5$.

The obtained nitride fluorescent material may have a composition represented by the following formula (II).

$$(Ba_{1-x-y}M^{12}_xM^2_y)_2Si_5N_8 \quad (II)$$

wherein $M^{12}$ represents at least one element selected from the group consisting of Sr, Ca, and Mg; $M^2$ represents at least one element selected from the group consisting of Eu, Ce, Tb, and Mn; and x and y satisfy $0 \leq x < 1.0$, $0.001 \leq y < 0.5$, and $0.001 \leq x+y < 1.0$ respectively. It is preferred that $0 < x < 1.0$ is satisfied.

The product of the parameter y and 2 represents a molar ratio of at least one metal element $M^2$ selected from the group consisting of Eu, Ce, Tb, and Mn in 1 mol of the chemical composition of the nitride fluorescent material. The metal element $M^2$ is an activator of the nitride fluorescent material. From the viewpoint of obtaining a ceramic sintered body having high light emission intensity, the parameter y is preferably in a range of 0.001 or more and less than 0.5 ($0.001 \leq y < 0.5$), more preferably in a range of 0.005 or more and 0.4 or less ($0.005 \leq y \leq 0.4$), even more preferably in a range of 0.007 or more and 0.3 or less ($0.007 \leq y \leq 0.3$), still more preferably in a range of 0.01 or more and 0.2 or less ($0.01 \leq y \leq 0.2$). The "molar ratio" refers to a molar amount of the element in 1 mol of the chemical composition contained in the fluorescent material.

As shown in the formula (II), in the case of containing Ba and at least one alkaline earth metal element $M^{12}$ selected from the group consisting of Sr, Ca, and Mg in the composition of the nitride fluorescent material, the product of the parameter x and 2 represents a molar ratio of the alkaline earth metal element $M^{12}$ in 1 mol of the composition of the nitride fluorescent material. The parameter x is, though depending on the amount of the activator, preferably in a range of 0 or more and 0.75 or less ($0 \leq x \leq 0.75$), more preferably in a range of 0.01 or more and 0.6 or less ($0.01 \leq x \leq 0.60$), even more preferably in a range of 0.05 or more and 0.5 or less ($0.05 \leq x \leq 0.50$).

The average particle diameter (Fisher Sub-Sieve Sizer's number) of the obtained nitride fluorescent material, as measured according to the Fisher Sub-Sieve Sizer method (hereinafter also referred to as "FSSS method") is preferably less than 5.0 μm. When the average particle diameter of the nitride fluorescent material, as measured according to the FSSS method, is less than 5.0 μm, a molded body having few voids can be formed. The average particle diameter of the nitride fluorescent material, as measured according to the FSSS method, is more preferably 4.5 μm or less, even more preferably 4.0 μm or less; and may be 0.1 μm or more, or may also be 0.5 μm or more. The FSSS method is a type of an air permeability method and a method for measuring a specific surface area by utilizing the flow resistance of air to determine a particle diameter.

Preparation of Molded Body

In the step of preparing a molded body, the molded body is preferably formed of a nitride fluorescent material having a crystallite size of 550 Å or less for obtaining a sintered body having high relative density. The molded body is preferably composed of only a nitride fluorescent material having a crystallite size of 550 Å or less. That is, the content of the nitride fluorescent material having a crystallite size of 550 Å or less in the molded body is preferably 100% by mass. The molded body may contain voids in addition to the nitride fluorescent material having a crystallite size of 550 Å or less, and the content of the nitride fluorescent material having a crystallite size of 550 Å or less may be 95% by mass or more, 97% by mass or more, 98% by mass or more, 99% by mass or more, or 99.5% by mass or more.

In the molded body preparing step, the nitride fluorescent material having a crystallite size of 550 Å or less is molded into a desired shape to obtain a molded body. As the method for molding a molded body, a known method, such as a press molding method in which the powder is molded by pressing, or a slurry molding method in which a slurry containing the powder is prepared to obtain a molded body from the slurry, can be employed. Examples of the press molding method may include a die press molding method and a cold isostatic pressing (hereinafter also referred to as "CIP") method that is specified in No. 2109 of JIS Z2500:2000. As for the molding method, the two types of methods may be employed for forming the shape of the molded body, and the CIP treatment may be performed after the die press molding. In the CIP treatment, the molded body is preferably pressed using water as a medium.

The pressure in the die press molding is preferably in a range of 5 MPa or more and 50 MPa or less, more preferably in a range of 5 MPa or more and 20 MPa or less, even more preferably in a range of 5 MPa or more and 15 MPa or less in terms of gauge pressure. When the pressure in the die press molding is in the above range, the molded body can be formed into a desired shape.

The pressure in the CIP treatment is preferably in a range of 50 MPa or more and 250 MPa or less, more preferably in a range of 100 MPa or more and 200 MPa or less. When the pressure in the CIP treatment is in the above range, the density of the molded body is increased, and a molded body having a substantially uniform density on the whole can be obtained, thereby increasing the density of a sintered body obtained in the following calcining step.

Calcining Step

The calcining step is a step of calcining a molded body at a temperature in a range of 1,600° C. or more and 2,200° C. or less to obtain a sintered body. By calcining a molded body containing a nitride fluorescent material having a crystallite size of 550 Å or less at a temperature in a range of 1,600° C. or more and 2,200° C. or less, the number of voids contained in the molded body is reduced to increase the relative density, and a ceramic sintered body having high light emission intensity can be obtained.

In order to further improve the crystallinity of the nitride fluorescent material having a crystallite size of 550 Å or less and a relatively low crystallinity and to suppress the decomposition of the crystal structure, the temperature in the calcining step is preferably in a range of 1,600° C. or more and 2,100° C. or less, more preferably in a range of 1,600° C. or more and 2,000° C. or less, even more preferably in a range of 1,600° C. or more and 1,900° C. or less, still more preferably in a range of 1,600° C. or more and 1,800° C. or less.

Examples of the calcining method may include an atmospheric sintering method in which the calcining is performed under a non-oxidizing atmosphere without applying pressure or load, a pressurized atmospheric sintering method in which the calcining is performed under a pressurized non-oxidizing atmosphere, a hot-press sintering method, and a spark plasma sintering (SPS) method. The non-oxidizing atmosphere refers to an atmosphere in which an amount of oxygen is several hundred ppm by volume or less.

The calcining step is preferably performed in an atmosphere containing nitrogen gas. The atmosphere containing nitrogen gas is preferably an atmosphere containing at least 99% by volume of nitrogen. The atmosphere containing nitrogen gas preferably contains nitrogen in an amount of 99% by volume or more, more preferably 99.5% by volume or more. The atmosphere containing nitrogen gas may contain a trace amount of another gas, such as oxygen, in addition to nitrogen, and the content of oxygen in the atmosphere containing nitrogen gas is preferably 1% by volume or less, more preferably 0.5% by volume or less, even more preferably 0.1% by volume or less, still more preferably 0.01% by volume or less, particularly preferably 0.001% by volume or less. The atmosphere in the calcining step may also be a nitrogen-containing atmosphere having a reducing property, or may be an atmosphere containing hydrogen gas and nitrogen. In the case of containing hydrogen gas in the atmosphere containing nitrogen in the calcining step, the content of the hydrogen gas in the atmosphere is preferably 1% by volume or more, more preferably 5% by volume or more, even more preferably 10% by volume or more. The calcining atmosphere may also be a reductive atmosphere using a solid carbon in an air atmosphere.

By calcining a molded body in the atmosphere containing nitrogen gas, a ceramic sintered body having high relative density, which contains a nitride fluorescent material having high light emission intensity, can be obtained. This may be because, for example, when the metal element $M^2$ serving as an activator is Eu, the ratio of divalent $Eu^{2+}$ capable of contributing light emission is increased in the nitride fluorescent material. The divalent $Eu^{2+}$ is readily oxidized into a trivalent $Eu^{3+}$, but by calcining a molded body in a highly-reductive atmosphere, the trivalent $Eu^{3+}$ of the nitride fluorescent material contained in the molded body may be reduced into the divalent $Eu^{2+}$. Therefore, the ratio of the divalent $Eu^{2+}$ contained in the nitride fluorescent material is increased, so that a ceramic sintered body containing a nitride fluorescent material having high light emission intensity can be obtained.

The atmospheric pressure in the calcining step is preferably in a range of 0.1 MPa or more and 2.0 MPa or less, more preferably in a range of 0.2 MPa or more and 1.5 MPa or less, even more preferably in a range of 0.5 MPa or more and 1.2 MPa or less. The atmospheric pressure is preferably a gauge pressure. When the atmospheric pressure in the calcining step is in the above range, the crystallinity of the nitride fluorescent material having a crystallite size of 550 Å or less and a relatively low crystallinity is improved, and the decomposition of the crystal structure is suppressed, so that a ceramic sintered body containing a nitride fluorescent material having high emission intensity can be obtained.

The calcining time may be appropriately selected depending on the atmospheric pressure. For example, the calcining time is in a range of 0.5 hour or more and 20 hours or less, and preferably in a range of 1 hour or more and 10 hours or less.

The calcining step may include two or more calcining steps, such as a primary calcining step and a secondary calcining step. In the case of containing two or more calcining steps, a ceramic sintered body obtained by a primary calcining step may be subjected to secondary calcining at a temperature in a range of 1,400° C. or more and 2,200° C. or less according to a hot isostatic pressing (hereinafter also referred to as "HIP") method that is specified in No. 2112 of JIS Z2500:2000. By further subjecting a ceramic sintered body obtained by primary calcining to secondary calcining according to the HIP treatment, the density of the ceramic sintered body can be further increased, and a ceramic sintered body capable of emitting light having a desired light emission peak wavelength with less chromaticity unevenness through irradiation of the excitation light can be obtained. The secondary calcining temperature is preferably in a range of 1,600° C. or more and 2,100° C. or less in order to suppress the decomposition of the crystal structure in the nitride fluorescent material.

In the case of performing the secondary calcining according to the HIP treatment, the pressure in the HIP treatment is preferably in a range of 50 MPa or more and 300 MPa or less, more preferably in a range of 80 MPa or more and 200 MPa or less. When the pressure in the HIP treatment is in the above range, the whole of the ceramic sintered body can have uniform and higher density without deteriorating the crystal structure of the nitride fluorescent material contained in the sintered body.

For example, the time for performing the secondary calcining may be in a range of 0.5 hour or more and 20 hours or less, and preferably in a range of 1 hour or more and 10 hours or less.

Processing Step

The method for producing a ceramic sintered body may include a step of processing the resulting ceramic sintered body. Examples of the processing step may include a step of cutting the resulting ceramic sintered body into a desired size. A known method can be utilized for the method for cutting a ceramic sintered body, and examples thereof may include blade dicing, laser dicing, and wire sawing. Among others, wire sawing is preferred since the cut surface becomes flat with high accuracy. By the processing step, a ceramic sintered body having a desired thickness and size can be obtained. The thickness of the ceramic sintered body is not particularly limited, but is preferably in a range of 1 μm or more and 1 mm or less, more preferably in a range of 10 μm or more and 800 μm or less, even more preferably in a range of 50 μm or more and 500 μm or less, still more preferably in a range of 100 μm or more and 400 μm or less in consideration of the mechanical strength and the efficiency of wavelength conversion.

Relative Density of Ceramic Sintered Body

The relative density of the resulting ceramic sintered body is preferably 80% or more, more preferably 85% or more, even more preferably 90% or more, still more preferably 91% or more. The relative density of the ceramic sintered body may be 100%, may be 99% or less, or may be 98% or less. When the relative density of the resulting ceramic sintered body is 80% or more, the density of the ceramic sintered body becomes high, the number of voids is reduced, and light scattering due to the voids is suppressed, so that a ceramic sintered body having high light emission intensity can be produced.

In the present specification, the relative density of the ceramic sintered body refers to a value calculated by an apparent density of the ceramic sintered body relative to a true density of the ceramic sintered body. The relative density is calculated by the following calculation formula (1).

$$\text{Relative density (\%) of ceramic sintered body} = \frac{\text{Apparent density of ceramic sintered body}}{\text{True density of ceramic sintered body}} \times 100 \quad (1)$$

The true density of the ceramic sintered body refers to a value obtained by multiplying the mass ratio (% by mass) of the nitride fluorescent material by the true density of the nitride fluorescent material, relative to 100% by mass of the ceramic sintered body. When the ceramic sintered body is composed of only the nitride fluorescent material, the true density of the ceramic sintered body is equal to the true density of the nitride fluorescent material.

The apparent density of the ceramic sintered body refers to a value obtained by dividing the mass of the ceramic sintered body by the volume of the ceramic sintered body, which is determined by the Archimedes' method, and is calculated by the following calculation formula (2). In the calculation formula (2), the volume of the ceramic sintered body refers to a volume determined by the Archimedes' method.

$$\text{Apparent density (g/cm}^3\text{) of ceramic sintered body} = \frac{\text{Mass (g) of ceramic sintered body}}{\text{Volume (cm}^3\text{) of ceramic sintered body}} \quad (2)$$

Ceramic Sintered Body

The ceramic sintered body is a ceramic sintered body that comprises or is composed of a nitride fluorescent material having a composition containing: at least one alkaline earth metal element $M^1$ selected from the group consisting of Ba, Sr, Ca, and Mg; at least one metal element $M^2$ selected from the group consisting of Eu, Ce, Tb, and Mn; Si; and N, in which a total molar ratio of the alkaline earth metal element $M^1$ and the metal element $M^2$ in 1 mol of the composition is 2, a molar ratio of the metal element $M^2$ is a product of 2 and a parameter y wherein y is in a range of 0.001 or more and less than 0.5, a molar ratio of Si is 5, and a molar ratio of N is 8, wherein the relative density is 80% or less. The nitride fluorescent material contained in the ceramic sintered body may contain Ba and at least one alkaline earth metal element $M^{12}$ selected from the group consisting of Sr, Ca, and Mg as the alkaline earth metal element $M^1$. The molar ratio of the alkaline earth metal element $M^{12}$ in 1 mol of the composition of the nitride fluorescent material is preferably a product of a parameter x in a range of 0 or more and 0.75 or less and 2. The ceramic sintered body may be composed of a nitride fluorescent material having a specific composition, and has a high relative density of 80% or more. Therefore, the ceramic sintered body emits light having high light emission intensity and a desired light emission peak wavelength through irradiation of the excitation light. The content of each element constituting the nitride fluorescent material in the ceramic sintered body can be measured using an inductively coupled plasma (ICP) atomic emission spectroscopy, and the composition of the nitride fluorescent material can be determined from the results of the elemental analysis.

The ceramic sintered body is preferably composed of a nitride fluorescent material having a composition represented by the formula (I), and may be composed of a nitride fluorescent material having a composition represented by the formula (II). When the ceramic sintered body is composed of a nitride fluorescent material having a composition represented by the formula (I) or the formula (II), deterioration is suppressed as compared with a fluorescent member using a binder, durability is excellent, and high light emission intensity can be maintained.

The relative density of the ceramic sintered body is 80% or more, and preferably 85% or more, more preferably 90% or more, even more preferably 91% or more. When the relative density of the ceramic sintered body is large, scattering of light due to voids is reduced, and the light emission intensity becomes high. In addition, when the relative density of the ceramic sintered body is high, the ceramic sintered body may not be cracked or broken even in the case where the ceramic sintered body is subjected to processing, such as cutting, and the occurrence of chromaticity unevenness can be suppressed in the case of using the ceramic sintered body for a light emitting device. The relative density of the ceramic sintered body is more preferably 91% or more. The relative density of the ceramic sintered body may be 100%, may be 99.9% or less, or may be 99.8% or less.

Light Emitting Device

The light emitting device is constituted by combining the ceramic sintered body obtained by the above producing method and a light emitting element such as an LED or an LD. The light emitting device converts excitation light emitted from the light emitting element by the ceramic sintered body, and emits light having a desired light emission peak wavelength. The light emitting device emits mixed light of the light emitted from the light emitting element and the light of which the wavelength is converted by the ceramic sintered body. The light emitting device may be used in combination of a ceramic sintered body containing the nitride fluorescent material and another ceramic sintered body containing a fluorescent material other than the nitride fluorescent material.

The light emitting element preferably has a light emission peak wavelength in a range of 380 nm or more and 570 nm or less, more preferably in a range of 400 nm or more and 550 nm or less. For example, the light emitting element is preferably a semiconductor light emitting element using a nitride-based semiconductor $(In_XAl_YGa_{1-X-Y}N, 0 \leq X, 0 \leq Y, X+Y \leq 1)$. Using a semiconductor light emitting element as an excitation light source enables a high efficiency stable light emitting device that has high linearity of output relative to input and is resistant to mechanical shock to be obtained.

EXAMPLES

The present invention is hereunder specifically described by reference to the following Examples. The present invention is not limited to these Examples.

Example 1

Preparation of Nitride Fluorescent Material

Ba and Sr were used as alkaline earth metal elements $M^1$ contained in the nitride fluorescent material, and Eu was used as a metal element $M^2$. $Ba_3N_2$, $Sr_3N_2$, EuN, and $Si_3N_4$ were used as raw materials. The compounds serving as raw materials were weighed in a glove box with an inert gas atmosphere such that a molar ratio of each element was Ba:Sr:Eu:Si=0.5:1.42:0.08:5 as a charged amount, and the compounds were mixed to obtain a raw material mixture. The resulting raw material mixture was filled into a crucible, and heat-treated at a gas pressure of 0.9 MPa in terms of gauge pressure and a temperature of 1,400° C. for 5 hours in an atmosphere containing nitrogen in an amount of 99.9% by volume or more and oxygen (0.1% by volume or less) as the balance, thereby obtaining a sintered product. Since the particles of the resulting sintered product were sintered together, the sintered product was subjected to wet dispersion followed by sieve classification to eliminate coarse particles and fine particles, thereby obtaining a nitride fluorescent material having a composition of $(Ba_{0.25}Sr_{0.71}Eu_{0.04})_2Si_5N_8$ and having an average particle diameter shown in Table 1 with uniform particle diameter.

Preparation of Molded Body

The resulting nitride fluorescent material was filled into a die and press-molded at a pressure of 7 MPa (71.38 kgf/cm$^2$) to form a cylindrical molded body having a diameter of 28.5 mm and a thickness of 10 mm.

Calcining

The resulting molded body was placed in a calcining furnace (manufactured by Fuji Dempa Kogyo Co., Ltd.), and calcined while maintaining a temperature of 1, 700° C. and a pressure of 0.9 MPa for 5 hours in an atmosphere containing nitrogen in an amount of 99.9% by volume or more and oxygen (0.1% by volume or less) as the balance, thereby obtaining a ceramic sintered body.

Example 2

A ceramic sintered body was obtained in the same manner as in Example 1 except that the temperature for heat-treating the raw material mixture was changed to 1,600° C. in the nitride fluorescent material preparing step.

Comparative Example 1

A ceramic sintered body was obtained in the same manner as in Example 1 except that the temperature for heat-treating the raw material mixture was changed to 1,800° C. in the nitride fluorescent material preparing step.

Average Particle Diameter of Fluorescent Material According to FSSS Method

The average particle diameter (Fisher Sub-Sieve Sizer's number) of the nitride fluorescent material used in each of Examples and Comparative Example was measured according to the FSSS method using a Fisher Sub-Sieve Sizer Model 95 (manufactured by Fisher Scientific Inc.). The results are shown in Table 1.

Light Emission Characteristics of Fluorescent Material
Light Emission Spectrum and Relative Light Emission Intensity (%)

The light emission characteristics of the nitride fluorescent material in each of Examples and Comparative Example were measured. Using a fluorospectrophotometer (product name: QE-2000, manufactured by Otsuka Electronics Co., Ltd.), each fluorescent material was irradiated with light having an excitation wavelength of 450 nm to measure the light emission spectrum thereof. The relative light emission intensity (%) at the light emission peak wavelength of 630 nm, where the light emission intensity of the obtained light emission spectrum was the maximum, was determined. The relative light emission intensity (%) was calculated when the light emission intensity at the light emission peak wavelength of the nitride fluorescent material in Comparative Example 1 was set as 100%. The results are shown in Table 1.

Luminescent Chromaticity x, y of Fluorescent Material

As for the nitride fluorescent material in each of Examples and Comparative Example, the chromaticity x, y in chromaticity coordinates of Commission international del'eclairage (CIE) 1931 color system was measured using a quantum efficiency measurement system in the fluorospectrophotometer (product name: QE-2000, manufactured by Otsuka Electronics Co., Ltd.). The results are shown in Table 1.

XRD Measurement
Crystallite Size (Å) of Fluorescent Material

As for the nitride fluorescent material in each of Examples and Comparative Example, the XRD measurement (X-ray: CuKα, tube voltage: 40 kV, tube current: 20 mA, scanning range: 10°≤2θ≤70°, radiation source: CuKα, scanning axis: 2θ/θ, measuring method: FP (fundamental parameter method), counting unit: counts, step width: 0.02°, counting time: 10) was performed using an X-ray diffraction apparatus (product name: Ultima IV, manufactured by Rigaku Corporation). The measurement data was read using analysis software PDXL (manufactured by Rigaku Corporation) and refined using No. 01-085-0101 of the ICDD (International Center for Diffraction Data) card of $Ba_2Si_5N_8$ single phase, and the crystallite size was then calculated according to the Halder-Wagner method (the width was corrected using an external standard sample). The results are shown in Table 1.

TABLE 1

| | Temperature for Heat-treating Raw Material Mixture (° C.) | Composition | Average Particle Diameter (μm) | Light Emission Characteristics | | Relative Light Emission Intensity (%) | XRD Diffraction Crystallite Size (Å) |
| --- | --- | --- | --- | --- | --- | --- | --- |
| | | | | Chromaticity | | | |
| | | | | x | y | | |
| Example 1 | 1400 | $(Ba_{0.25}Sr_{0.71}Eu_{0.04})_2Si_5N_8$ | 0.7 | 0.580 | 0.418 | 54.8 | 395 |
| Example 2 | 1600 | $(Ba_{0.25}Sr_{0.71}Eu_{0.04})_2Si_5N_8$ | 1.1 | 0.584 | 0.415 | 71.7 | 435 |
| Comparative Example 1 | 1800 | $(Ba_{0.25}Sr_{0.71}Eu_{0.04})_2Si_5N_8$ | 5.8 | 0.599 | 0.401 | 100.0 | 567 |

Relative Density (%) of Ceramic Sintered Body

The relative density of the ceramic sintered body in each of Examples and Comparative Example was calculated by the calculation formulae (1) and (2). The true density of the ceramic sintered body was equal to the true density of the nitride fluorescent material that formed the molded body in each of Examples and Comparative Example, and the true density of the nitride fluorescent material was 4.36 g/cm$^3$. The results are shown in Table 2.

Relative Light Emission Intensity (%) of Ceramic Sintered Body

Figure 2:
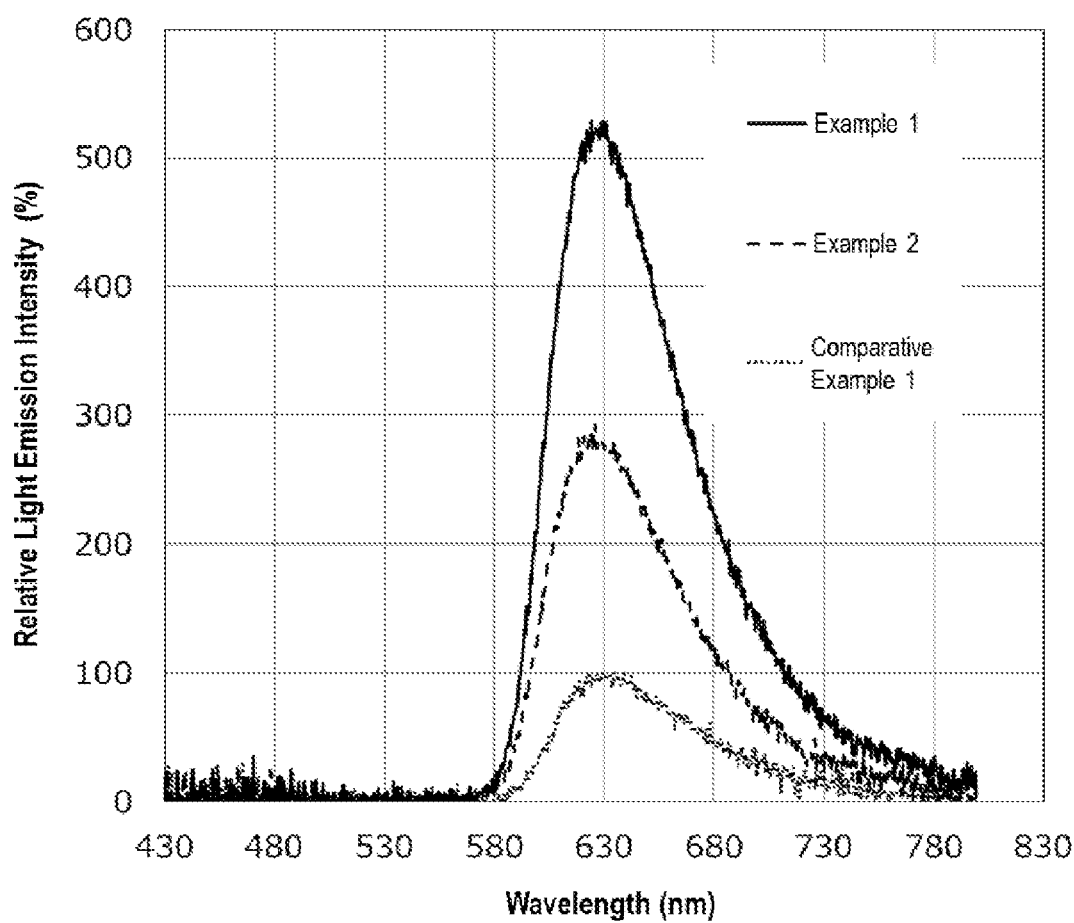
FIG. 2 is a graph showing light emission spectra of ceramic sintered bodies according to Examples 1 and 2, and Comparative Example 1.

The ceramic sintered body in each of Examples and Comparative Example was cut into a thickness of 300 μm using a wire saw to form a sample. An LED chip composed of a nitride semiconductor having a light emission peak wavelength of 455 nm was used as a light source, and the sample of the ceramic sintered body was irradiated with light emitted from the light source. Thereafter, the light emission spectrum in a wavelength range of 430 nm or more and 800 nm or less, which was obtained from the sample of the ceramic sintered body upon receiving the light emitted from the light source, was measured using the fluorospectrophotometer. The relative light emission intensity (%) at the light emission peak wavelength of 630 nm, where the light emission intensity of the obtained light emission spectrum was the maximum, was determined. The relative light emission intensity (%) of the ceramic sintered body was calculated when the light emission intensity at the light emission peak wavelength of 630 nm, where the light emission intensity the ceramic sintered body in Comparative Example 1 was the maximum, was set as 100%. The results are shown in Table 2. In addition, FIG. 2 is a graph showing light emission spectra of relative light emission intensity with respect to the wavelengths in Examples 1 and 2, and Comparative Example 1, when the integral value of the light emission spectrum in Comparative Example 1 is set as 100%.

Luminescent Chromaticity x, y of Ceramic Sintered Body

As for the sample of the ceramic sintered body in each of Examples and Comparative Example, the chromaticity x, y in chromaticity coordinates of CIE 1931 color system was measured using the quantum efficiency measurement system in the fluorospectrophotometer (product name: QE-2000, manufactured by Otsuka Electronics Co., Ltd.). The results are shown in Table 2.

TABLE 2

| | Relative Density (%) | Chromaticity x | Chromaticity y | Relative Light Emission Intensity (%) |
|---|---|---|---|---|
| Example 1 | 97.0 | 0.676 | 0.322 | 623.1 |
| Example 2 | 91.8 | 0.672 | 0.321 | 369.2 |
| Comparative Example 1 | 64.5 | 0.700 | 0.319 | 100.0 |

As shown in Table 2, the relative light emission intensity of the ceramic sintered body in each of Examples 1 and 2 was higher than that of the ceramic sintered body in Comparative Example 1. The nitride fluorescent material used for the ceramic sintered body in each of Examples 1 and 2 had a crystallite size of 550 Å or less, and had low crystallinity even for a nitride fluorescent material. Thus, the relative light emission intensity of the nitride fluorescent material itself was lower than that of the nitride fluorescent material used for the ceramic sintered body in Comparative Example 1 having a crystallite size of 550 Å or more. However, the ceramic sintered body obtained by forming a molded body using a nitride fluorescent material having a crystallite size of 550 Å or less and calcining the molded body at a temperature in a range of 1,600° C. or more and 2,200° C. or less had a high light emission intensity exceeding three times higher than that of the ceramic sintered body in Comparative Example 1 having a crystallite size of 550 Å or more. Although the reason why the ceramic sintered body in each of Examples 1 and 2 had higher light emission intensity than that of the ceramic sintered body in Comparative Example 1 is not clear, it is presumed that, when the nitride fluorescent material having a relatively low crystallite size is calcined at a temperature in a range of 1,600° C. or more and 2,200° C. or less, the number of voids in the ceramic sintered body is reduced and the light emission intensity becomes high.

In contrast, the light emission intensity of the ceramic sintered body in Comparative Example 1 was lower than that of the ceramic sintered body in each of Examples 1 and 2. It is presumed that this is because the ceramic sintered body in Comparative Example 1 uses the nitride fluorescent material having good crystallinity with a crystallite size of more than 550 Å, the relative density of the ceramic sintered body is low, and a large number of voids are present therein.

The ceramic sintered body according to the present disclosure emits light through irradiation of excitation light, and can be utilized as a wavelength converting member capable of converting the wavelength of light emitted from an LED or an LD, and a material for a solid scintillator.

The invention claimed is:

1. A method for producing a ceramic sintered body, comprising:
a step of heat-treating a raw material mixture containing:
a first nitride containing at least one alkaline earth metal element M' selected from the group consisting of Ba, Sr, Ca, and Mg,
a second nitride containing at least one metal element M$^2$ selected from the group consisting of Eu, Ce, Tb, and Mn,
and a third nitride containing Si,
at a temperature in a range of 980° C. or more and 1,680° C. or less—in an atmosphere containing nitrogen to obtain a nitride fluorescent material having a composition containing: the at least one alkaline earth metal element M' selected from the group consisting of Ba, Sr, Ca, and Mg; the at least one metal element M$^2$ selected from the group consisting of Eu, Ce, Tb, and Mn; Si; and N, wherein a total molar ratio of the alkaline earth metal element M$^1$ and the metal element M$^2$ in 1 mol of the composition is 2, a molar ratio of the metal element M$^2$ is a product of 2 and a parameter y wherein y is in a range of 0.001 or more and less than 0.5, a molar ratio of Si is 5, and a molar ratio of N is 8, and wherein the nitride fluorescent material has a crystallite size, as calculated by X-ray diffraction measurement using the Halder-Wagner method, of 550 Å or less,
preparing a molded body that contains the nitride fluorescent material and
calcining the molded body at a temperature in a range of 1,600° C. or more and 2,200° C. or less to obtain a sintered body.

2. The method for producing a ceramic sintered body according to claim 1, wherein a temperature for calcining the molded body is in a range of 1,600° C. or more and 2,100° C. or less.

3. The method for producing a ceramic sintered body according to claim 1, wherein a temperature for heat-treating the raw material mixture is in a range of 1,350° C. or more and 1,650° C. or less.

4. The method for producing a ceramic sintered body according to claim 1, wherein the crystallite size of the nitride fluorescent material is in a range of 200 Å or more and 450 Å or less.

5. The method for producing a ceramic sintered body according to claim 1, wherein an average particle diameter, as measured according to the Fisher Sub-Sieve Sizer method, of the nitride fluorescent material is less than 5.0 μm.

6. The method for producing a ceramic sintered body according to claim 1, wherein the content of the nitride fluorescent material having a crystallite size of 550 Å or less in the molded body is 95% by mass or more.

7. The method for producing a ceramic sintered body according to claim 1, wherein the nitride fluorescent material has a composition represented by the following formula (I):

$$(M^1{}_{1-y}M^2{}_y)_2Si_5N_8 \qquad (I)$$

wherein $M^1$ represents at least one alkaline earth metal element selected from the group consisting of Ba, Sr, Ca, and Mg; $M^2$ represents at least one metal element selected from the group consisting of Eu, Ce, Tb, and Mn; and y satisfies $0.001 \leq y < 0.5$.

8. The method for producing a ceramic sintered body according to claim 1, wherein the molded body is formed by at least one method selected from a die press molding method, a cold isostatic pressing method, and a slurry molding method.

9. The method for producing a ceramic sintered body according to claim 8, wherein the molded body is formed by a die press molding method, and a pressure at the time of die press molding is in a range of 5 MPa or more and 50 MPa or less.

* * * * *